United States Patent [19]
Lin

[11] Patent Number: 5,590,065
[45] Date of Patent: Dec. 31, 1996

[54] DIGITAL DECIMATION FILTER FOR DELTA SIGMA ANALOG-TO-DIGITAL CONVERSION WITH REDUCED HARDWARE COMPELEXITY

[75] Inventor: Kun Lin, Austin, Tex.

[73] Assignee: Crystal Semiconductor Corporation, Ausitn, Tex.

[21] Appl. No.: 288,624

[22] Filed: Aug. 10, 1994

[51] Int. Cl.⁶ ........................................... G06F 17/10
[52] U.S. Cl. ........................ 364/724.1; 364/724.16; 364/724.17
[58] Field of Search ................ 364/724.1, 724.16, 364/724.17, 732, 733

[56] References Cited

U.S. PATENT DOCUMENTS

| | | | |
|---|---|---|---|
| 4,472,785 | 9/1984 | Kasuga | 364/724.1 |
| 4,775,851 | 10/1988 | Borth | 341/155 |
| 4,872,129 | 10/1989 | Pfeifer et al. | 364/724.1 |
| 4,876,542 | 10/1989 | van Bavel et al. | 342/143 |
| 4,972,360 | 11/1990 | Cukier et al. | 364/724.1 |
| 4,999,626 | 3/1991 | Asghar et al. | 341/126 |
| 5,079,734 | 1/1992 | Riley | 364/724.1 |
| 5,157,395 | 10/1992 | Del Signore et al. | 341/143 |
| 5,220,327 | 6/1993 | Abbiate et al. | 341/143 |
| 5,339,263 | 8/1994 | White | 364/724.1 |
| 5,450,083 | 9/1995 | Brewer | 364/724.1 |
| 5,455,782 | 10/1995 | Young et al. | 364/724.1 |
| 5,455,783 | 10/1995 | Yukawa | 364/724.1 |

OTHER PUBLICATIONS

Crystal Semiconductor Corporation, "CS4216 16–Bit Stereo Audio Codec," Crystal Semiconductor Audio Data Book, pp. 4–77 – 4–114, 1993.

Crystal Semiconductor Corporation, "CS5326 16 & 18–Bit Stereo A/D Converters for Digital Audio," Crystal Semiconductor Audio Data Book, pp. 3–5 – 3–24, 1992.

Russell J. Apfel et al., "A Single–Chip Frequency–Shift Key Modem Implemented Using Digital Signal Processing," IEEE J. Solid–State Circuits, vol. SC–19, pp. 869–877, Dec., 1984.

Max W. Hauser and Robert W. Broderson, "Circut and Technology Considerations for MOS Delta–Sigma A/D Converters," IEEE Proc. ISCAS'86, pp. 1310–1315, May, 1986.

Eugene B. Hogenauer, "An Economical Class of Digital Filters for Decimation and Interpolation," IEEE Trans. Acoust., Speech, Signal Processing, vol. ASSP-29, pp. 155–162, Apr., 1981.

Tapio Saramaki and Hannu Tenhunen, "Effiecient VLSI–Realizable Decimators for Sigma–Delta Analog–to–Digital Converters," IEEE Proc. ISCAS'88, pp. 1525–1528, Jun., 1988.

Primary Examiner—David H. Malzahn
Attorney, Agent, or Firm—Robert D. Lott

[57] ABSTRACT

A decimation filter includes a plurality of integration stages, at least one decimation stage, and a plurality of differentiation stages followed by a FIR filter. At least one of the integration stages, the decimation stage, and the differentiator stages, and the FIR filter are implemented in a single ALU which includes a single adder, a ROM, and a RAM. The different sampling rates of the integrator stage and the FIR filter requires the storage of intermediate results in RAM of the FIR filter calculations.

12 Claims, 9 Drawing Sheets

IIR IMPLEMENTATION

FIG. 9(a)

IIR LINEARIZED MODEL

FIG. 9(b)

TRUNCATION WITH NONZERO MEAN
FIG. 10A

TRUNCATION WITH ZERO MEAN BUT DEAD ZONE
FIG. 10B

TRUNCATION WITH ZERO MEAN AND WITHOUT DEAD ZONE
FIG. 10C

DIGITAL DECIMATION FILTER FOR DELTA SIGMA ANALOG-TO-DIGITAL CONVERSION WITH REDUCED HARDWARE COMPELEXITY

REFERENCE TO RELATED APPLICATION

Reference is made to a related application entitled A Digital Decimation Filter for Delta Sigma Anolog-to-Digital Conversion with Multiple Decimation Stages, in the name of Kun Lin, Brian Green, and Nickolas van Bavel which describes and claims a comb filter which is suitable for use in the decimation filter of the present invention, and which is hereby incorporated by reference.

This related application was filed on Aug. 10, 1994 and has been assigned Ser. No. 08/288,623.

Reference is also made to a related application entitled AN INFINITE IMPULSE RESPONSE HIGHPASS FILTER, in the name of Kun Lin and John Paulos which describes and claims an IIR filter suitable for use in the decimation filter on the present invention, and which is hereby incorporated by reference.

This related application was filed on Aug. 10, 1994 and has been assigned Ser. No. 08/288,625.

TECHNICAL FIELD

The present invention relates to delta-sigma analog-to-digital converters, and more particularly, to digital post processing of the oversampled digital data.

BACKGROUND OF THE INVENTION

Delta-sigma analog-to-digital converters promise high resolution without the stringent requirements on analog device matching of conventional analog data converters. Delta-sigma data converters are a good match to VLSI MOS technologies which can support extensive digital signal processing.

However, delta sigma techniques put heavy burdens on digital post processing of the signal. First, the decimation filter needs to decimate the high sample rate and coarsely quantized signal to high resolution Nyquist sampling rate data. Second, the decimation filter needs to provide sufficient attenuation of unwanted high frequency signals such that they will have minimum aliasing to the base band after decimation.

Two approaches are widely used in implementing the decimation filter. The first approach uses a one stage FIR (Finite Impulse Response) filter. Hardware complexity usually limits this approach to 64 OSR (oversampling ratio) or lower. Also, a one stage FIR filter has relatively low quantization noise filtering capability.

There are several reasons to use a delta sigma modulator with an OSR greater than 64. The noise in a delta-sigma analog-to-digital converter is mainly dominated by thermal noise sampled on to the input capacitors. The inband noise power is given by $$\frac{2KT}{(OSR)C},$$

so with the increase of OSR we can either improve the performance of the analog-to-digital converters or reduce the capacitor sizes while maintaining the same performance. With higher OSR, we can also reduce the order of the modulators, thus improve the stability and reducing the analog modulator area. For example, to achieve 16-bit performance at 64 OSR, a fourth order modulator is needed, but with 128 OSR a third order modulator will suffice.

As a second approach, multi-stage decimation filter is popular for higher OSR. The multi-stage decimation filter usually consists of several cascaded comb filters and a two stage FIR filter. The comb filters decimate the signal to 4 Fs, where Fs is Nyquist frequency or base band sampling frequency, and each FIR filter decimates the sample rate by a factor of two. There are two drawbacks with this approach. First, a large data storage unit (RAM) is needed. Second, complicated addressing circuitry is needed to compute the two stage FIR filter.

In delta-sigma analog-to-digital data converters, the analog modulator contributes unwanted DC offset. In some cases, a DC offset is deliberatively added to the input of the analog modulator to move the tones inherently associated with delta sigma modulation such that when decimated, these undesirable tones will not alias to the audible frequency band. A common way to cancel the DC offset is offset calibration during the initial power up of the chip. This kind of offset calibration scheme sometimes is not satisfactory because the DC offset drifts due to temperature change or switching at the input source.

It therefore can be appreciated that a decimation filter which can decimate a 128 OSR in a relatively small amount of chip area, and which effectively attenuates unwanted DC offset is highly desirable.

SUMMARY OF THE INVENTION

It is therefore an object of the present invention to provide a 128 OSR decimation filter which can be efficiently implemented in silicon.

It is also an object of the present invention to provide circuitry which effectively attenuates unwanted DC offset in a decimation filter.

Shown in an illustrated embodiment of the invention is a decimation filter which has a plurality of integration stages followed by a plurality of differentiation stages in which the decimation of the over sampled data occurs in at least two separate decimation stages.

In a further aspect of the decimation filter some of the integration stages operate at different repetition rates.

Also shown in an illustrated embodiment of the invention is a decimation filter comprising a plurality of integration stages and a plurality of differentiation stages in which at least one of the integration or differentiation stages has its own adder and accumulator hardware, and wherein at least two of the integration stages and at least two of the differentiation stages together with a FIR stage and an IIR stage is implemented in hardware comprising a single adder.

Further shown in an illustrated embodiment of the invention is an IIR filter in which the inverse of the sign of the data of the preceding data is added to the present data to provide an output which does not have a dead zone and which has a zero mean.

BRIEF DESCRIPTION OF THE DRAWINGS

The aforementioned and other features, characteristics, advantages, and the invention in general, will be better understood from the following, more detailed description taken in conjunction with the accompanying drawings in which.

It will be appreciated that for purposes of clarity and where deemed appropriate, reference numerals have been repeated in the figures to indicate corresponding features.

DETAILED DESCRIPTION OF THE PREFERRED EMBODIMENT

To overcome the drawbacks associated with conventional multi-stage decimation, the present invention uses a decimation filter with several cascaded comb filters and a one stage FIR filter. With only a one stage FIR filter, the comb filters will do most of the decimation task. As will be shown later, to achieve reasonable anti-aliasing with conventional or prior art comb filter implementation, the data path width is so large that it is no longer practical. One aspect of the present invention is to provide a comb filter structure that will achieve the same anti-aliasing performance with practical data path width.

With only a one stage FIR filter and canonical signed digit (CSD) coefficient optimization, it is possible to share the computations of the later stages of the comb filters with the FIR computation unit. Another aspect of the invention is to provide a data path structure and control sequence to achieve this computational resource sharing.

It is well known that IIR filters are susceptible to quantization noise. Truncation in IIR filters is preferred over rounding due to its simplicity in implementation. Conventional truncations introduce DC bias, and as will be shown later, this truncating DC bias is further amplified by an integrator which makes the output of the high pass filter unusable. Also, it is known that a high pass filter with a low cutoff frequency has a very long settling time. A further aspect of the invention is to provide an IIR filter implementation of the high pass filter with fast settling time and zero mean truncation and without a dead zone.

Figure 1:
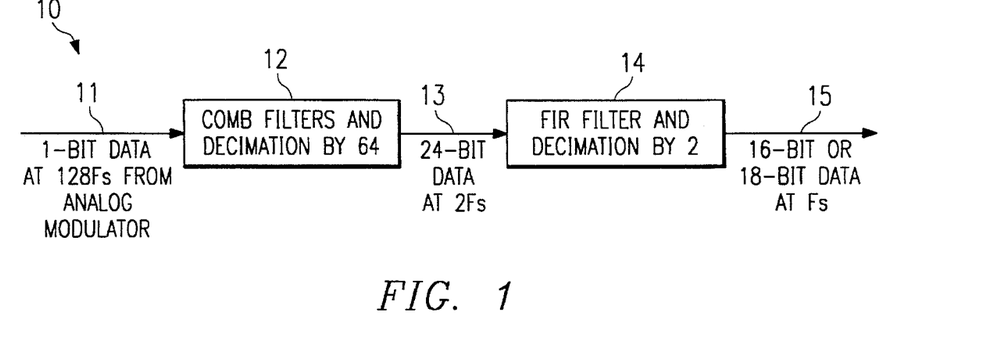
FIG. 1 is a block diagram of a decimation filter with comb filters and one stage FIR filter according to the present invention.

Referring now to FIG. 1, a decimation filter 10 according to the present invention receives 1-bit data at 128 Fs from an analog modulator (not shown) at a terminal 11 which, in turn, is connected to a comb filter 12. The output of the comb filter 12 is 24-bit data at 2 Fs at a node 13. The 24-bit data at 2 Fs is filtered and decimated by 2 in FIR filter 14, the output of which, at terminal 15, is 24-bit data at Fs. In order to reduce data storage (RAM) and simplify the RAM addressing scheme, only one stage of FIR filter is used and this FIR filter 14 will decimate the signal from 2 Fs to Fs. The FIR filter 14 also compensates for the passband distortion created by the comb filter 12.

Figure 2:
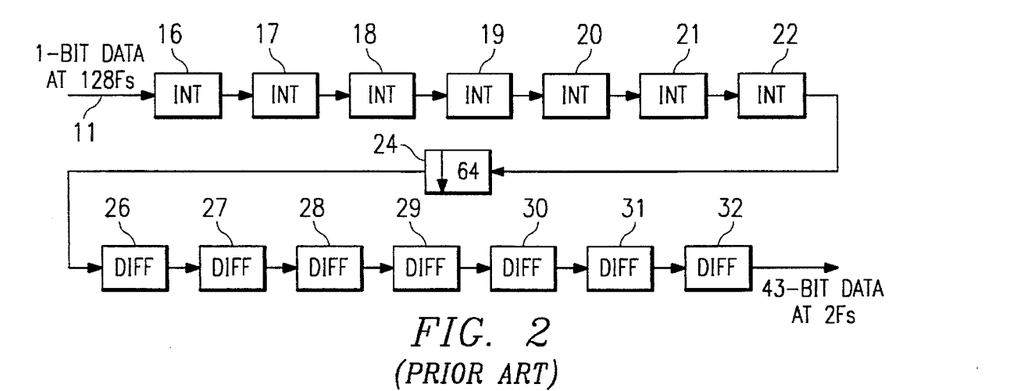
FIG. 2 is a block diagram of a prior art comb filter structure.
Figure 3A:
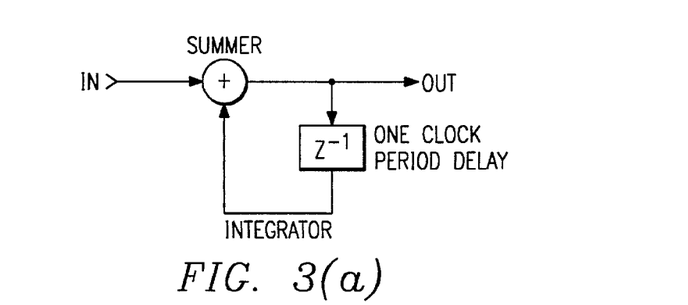
FIGS. 3(a) and 3(b) are block diagrams showing the implementations of the integrators and differentiators, respectively, shown in FIGS. 1 and 2.
Figure 3B:
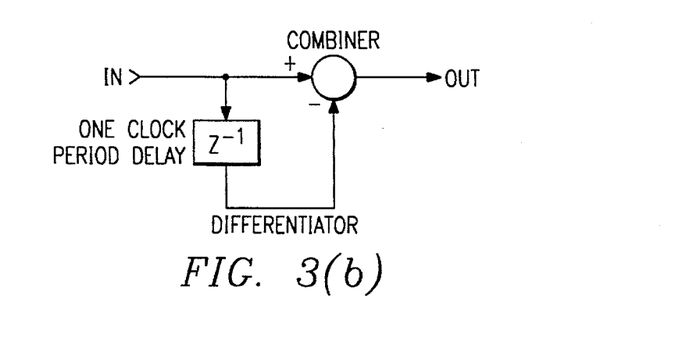
Figure 12:
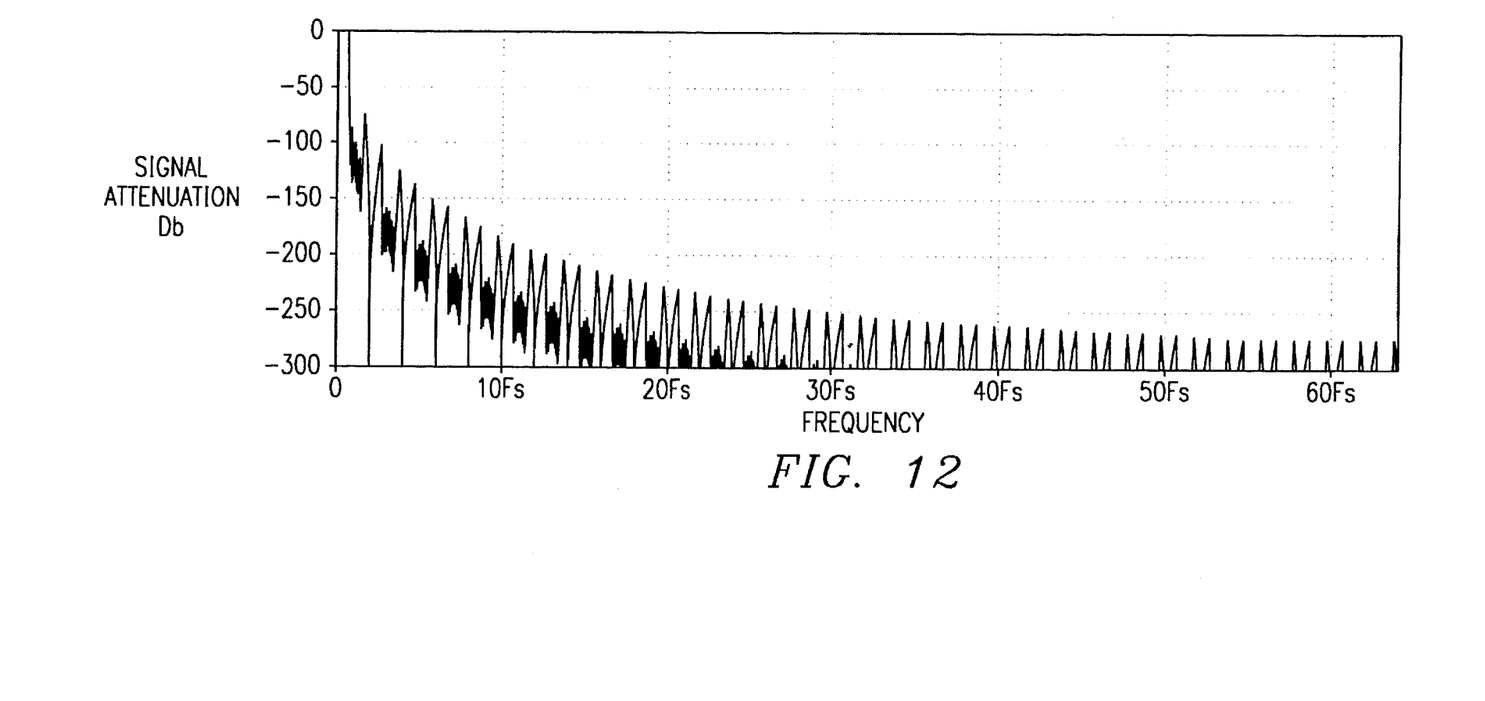
FIG. 12 is a plot of the frequency response of the comb filter (with one stage FIR) of FIG. 2.

Comb filters, in general, have the worst stopband attenuation at low frequencies (near 2 Fs). In order to achieve reasonable anti-alias, for example a minimum of −70 dB, comb filters have to put seven zeros at frequency 2 Fs. A conventional comb filter structure will consist of seven integrators 16–22 (INT), decimation stage 24 for decimation of the signal by 64 and seven differentiators 26–32 (DIFF) as shown in FIG. 2. The integrators 16–22 and differentiators 26–32 have the Z-transform of $1/(1-z^{-1})$ and $(1-z^{-1})$ respectively, and are implemented according to the block diagrams shown in FIGS. 3(a) and 3(b) respectively. The corresponding frequency response of the comb filter 12 in FIG. 2 (with one stage FIR) is shown in FIG. 12.

The comb filter 12 in FIG. 2 has the Z-transform of $$H_1(z) = \left( \frac{1-z^{-64}}{1-z^{-1}} \right)^7 = (1 + z^{-1} + z^{-2} + \ldots + z^{-63})^7$$

The magnitude of the frequency response of the comb filter 12 is $$|H_1(\omega)| = \left| \frac{\sin(32\omega)}{\sin(0.5\omega)} \right|^7$$

The comb filter 12 has a multiple of seven zeros at frequencies 2 Fs, 4 Fs, 6 Fs, . . . , 126 Fs.

It is known in the prior art that the register and adder lengths of this type of comb filter structure are determined by the overall DC gain of the comb filters and the input data word length. The DC gain of the above comb filter 12 is $64^7=2^{42}$. If the input is one bit data, then the register and adder lengths are 43 bits. It is therefore prohibitively expensive to implement the above comb filter structure.

Figure 4:
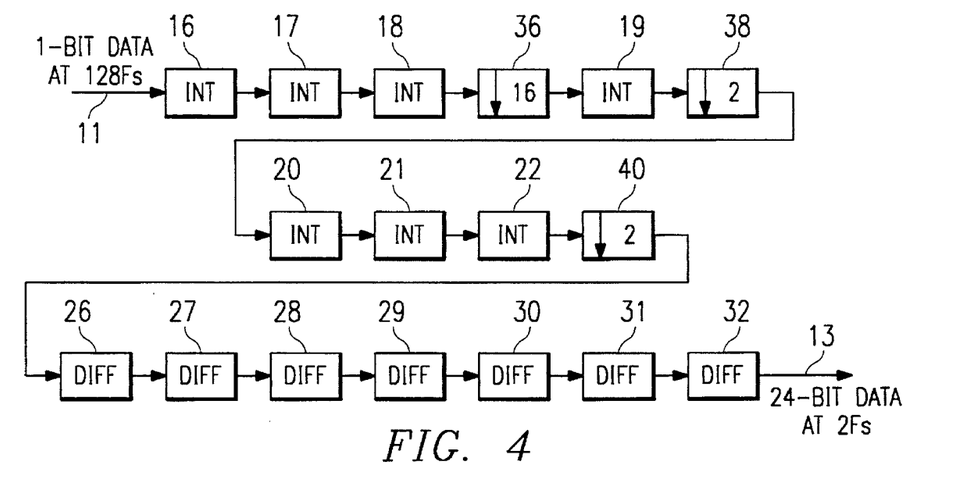
FIG. 4 is a block diagram of a comb filter according to the present invention.

Referring now to FIG. 4, the comb filter structure 34 according to the present invention still consists of seven integrators 16–22 and seven differentiators 26–32, but the decimation processes takes place not only at the end of the integrations but also at the middle of the integrations in the decimation stages 36 (after integrator 18), 38 (after integrator 19), and 40 (after integrator 22).

The Z-transform of the comb filter 34 is:

$$H_2(z) = \left(\frac{1-z^{-16}}{1-z^{-1}}\right)^3 \cdot \left(\frac{1-z^{-32}}{1-z^{-16}}\right)^4 \cdot \left(\frac{1-z^{-64}}{1-z^{-32}}\right)^7$$

$$= (1+z^{-1}+\ldots+z^{-15})^3 \cdot (1+z^{-16})^4 \cdot (1+z^{-32})^7$$

The magnitude of the frequency response of the comb filter 34 is $$|H_2(\omega)| = \left|\frac{\text{SIN}(8\omega)}{\text{SIN}(0.5\omega)}\right|^3 \cdot \left|\frac{\text{SIN}(16\omega)}{\text{SIN}(8\omega)}\right|^4 \cdot \left|\frac{\text{SIN}(32\omega)}{\text{SIN}(16\omega)}\right|^7$$

Figure 13:
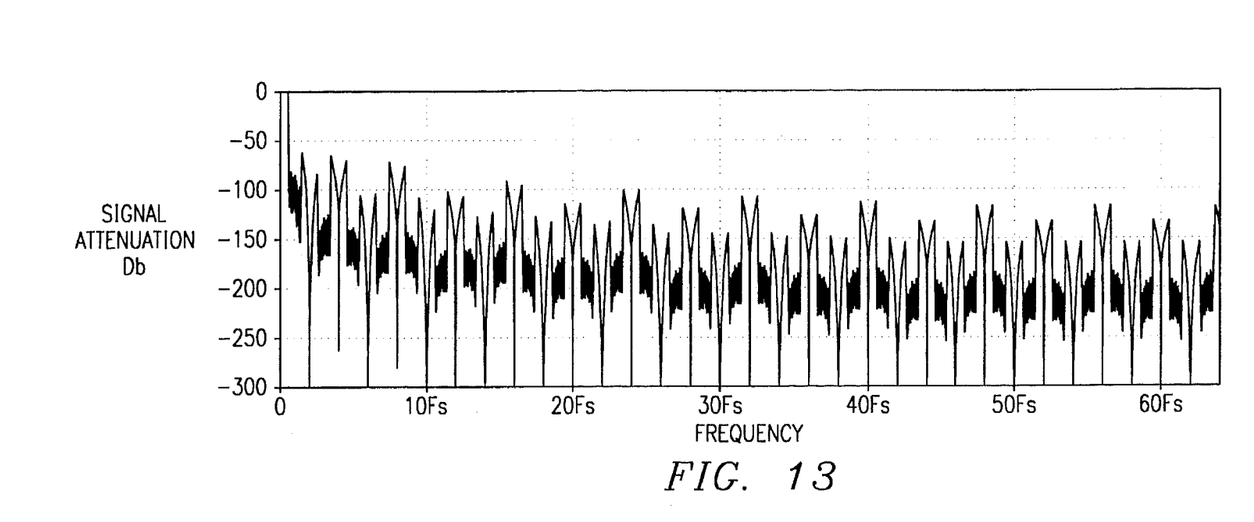
FIG. 13 is a plot of the frequency response of the comb filter (with one stage FIR) of FIG. 4.

The zeros of the comb filter 34 are: multiple of seven zeros at 2 Fs, 6 Fs, 10 Fs, ..., 126 Fs, multiple of four zeros at 4 Fs, 12 Fs, 20 Fs, ..., 124 Fs, and multiple of three zeros at 8 Fs, 16 Fs, 24 Fs, ..., 120 Fs. So the comb filter 34 in the present invention achieves the same antialias performance as the conventional comb filter 12 (FIG. 2) at frequencies around 2 Fs. FIG. 13 is the frequency response (with one stage FIR) of the comb filter 34.

The DC gain of the comb filter 34 is $16^3 \cdot 2^4 \cdot 2^7 = 2^{23}$. If the input is one bit data, then the register and adder lengths are 24 bits. So the present invention achieves a 19-bit reduction in register and adder lengths.

Both mathematical analysis and simulations show that the comb filter 34 has very good quantization noise filtering capabilities. For example, with a third order delta-sigma modulator and 128 oversampling ratio, a signal-to-noise ratio of 104 dB (at 1 kHz) can be achieved, which is only 4 dB lower than a conventional comb filter structure.

Figure 5:
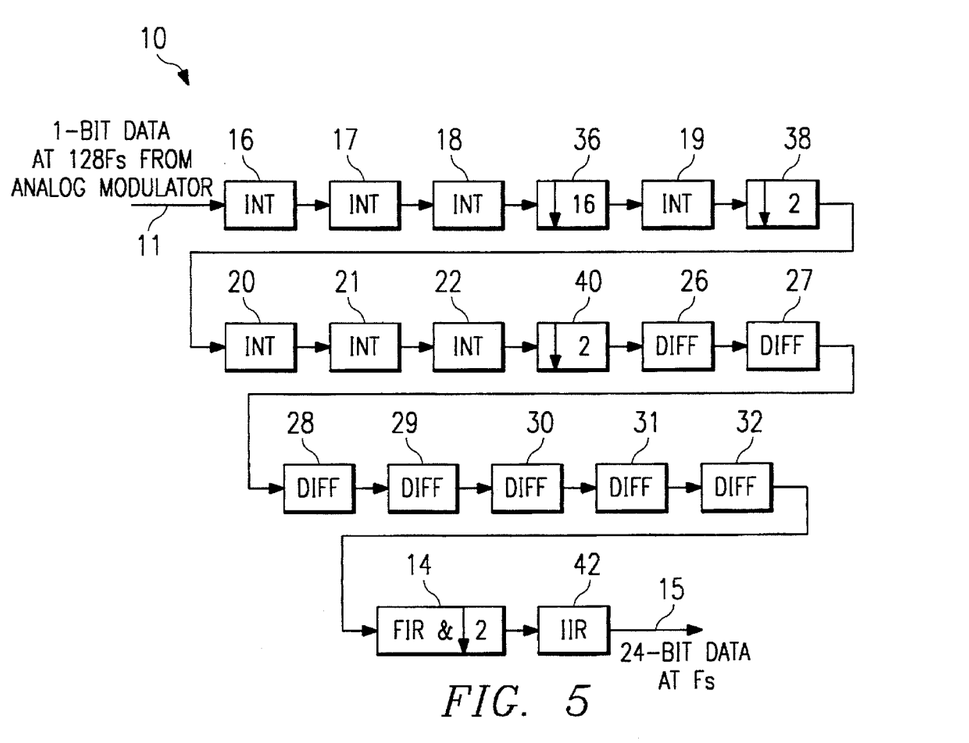
FIG. 5 is a more detailed block diagram of the decimation filter of FIG. 1.

Referring now to FIG. 5, the overall decimation filter architecture 40 according to the present invention is shown. The output of the comb filter 12 (running at 2 Fs) is further filtered by one stage of FIR 14 and a high pass IIR filter 42. This output can be truncated to obtain the normal 16-bit or 18-bit PCM digital audio data format. Since the output of the FIR filter 14 will be decimated by two, only every other output of the FIR filter 14 is computed.

The FIR filter 14 has the form of $$H_3(z) = c[0] + c[1]z^{-1} + c[2]z^{-2} + \ldots + c[49]z^{-49}$$

Figure 14:
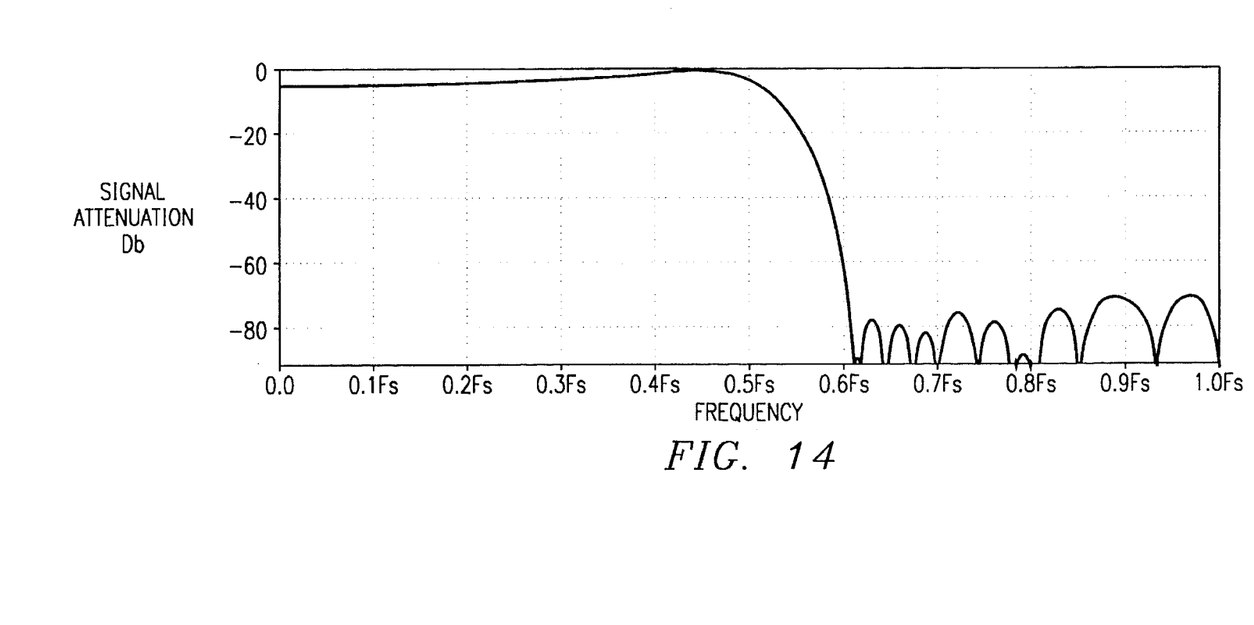
FIG. 14 is a plot of the frequency response of the one stage FIR filter shown in FIG. 5.

In order to avoid general multipliers, the coefficients of the FIR filter 14 are quantized and optimized to canonical signed digit (CSD) form. All the coefficients have the form of $c[i] = C_{i_1} 2^{m_1} + C_{i_2} 2^{m_2} + C_{i_3} 2^{m_3} + C_{i_4} 2^{m_4} + C_{i_5} 2^{m_5}$, where $C_{i_j} \in (\pm 1, 0)$. With the coefficients in CSD form, only shift and add operations are needed for the FIR filter computations. Table 1 summarizes the quantized coefficients. The frequency response of the FIR filter 14 is shown in FIG. 14. From the results of the coefficient quantization, a total of about 140 additions/subtractions per output sample are needed for the FIR filter computations. In digital audio applications, a master clock of 256 Fs or higher is available. To take advantage of the remaining clock cycles (about 116) in the present invention, the last four stages of integrators 19–22, all the differentiators 26–32 and the high pass IIR filter 42 are implemented with the FIR filter 14 using the same data path, RAM and control ROM. This significantly reduces the overall hardware circuitry and chip area.

TABLE 1

| CSD QUANTIZED COEFFICIENTS | |
| --- | --- |
| c[i] | coefficient value [CSD] |
| c[0] = c[49] | $2^{-13}$ |
| c[1] = c[48] | $-2^{-10}$ |
| c[2] = c[47] | $-2^{-9} -2^{-11}$ |
| c[3] = c[46] | 0 |
| c[4] = c[45] | $2^{-8}$ |
| c[5] = c[44] | 0 |
| c[6] = c[43] | $-2^{-7} +2^{-10}$ |
| c[7] = c[42] | 0 |
| c[8] = c[41] | $2^{-6} -2^{-8} -2^{-11}$ |
| c[9] = c[40] | $-2^{-11} +2^{-13}$ |
| c[10] = c[39] | $-2^{-6} -2^{-10} -2^{-12}$ |
| c[11] = c[38] | $2^{-9}$ |
| c[12] = c[37] | $2^{-5} -2^{-7} +2^{-9} -2^{-12} +2^{-14}$ |
| c[13] = c[36] | $-2^{-8} -2^{-10} -2^{-12}$ |
| c[14] = c[35] | $-2^{-5} -2^{-8} -2^{-10} -2^{-12}$ |
| c[15] = c[34] | $2^{-6} -2^{-8} -2^{-10}$ |
| c[16] = c[33] | $2^{-4} -2^{-7} -2^{-9} -2^{-12}$ |
| c[17] = c[32] | $-2^{-6} -2^{-8}$ |
| c[18] = c[31] | $-2^{-4} -2^{-6} +2^{-9} +2^{-11}$ |
| c[19] = c[30] | $2^{-5} +2^{-8} 2^{-11}$ |
| c[20] = c[29] | $2^{-3} -2^{-7} -2^{-9}$ |
| c[21] = c[28] | $-2^{-4} +2^{-9} +2^{-13}$ |
| c[22] = c[27] | $-2^{-2} +2^{-4} -2^{-6} -2^{-9} -2^{-11}$ |
| c[23] = c[26] | $2^{-3} -2^{-5} +2^{-9} +2^{-11}$ |
| c[24] = c[25] | $2^{-1} +2^{-4} +2^{-6} -2^{-10}$ |

Figure 6:
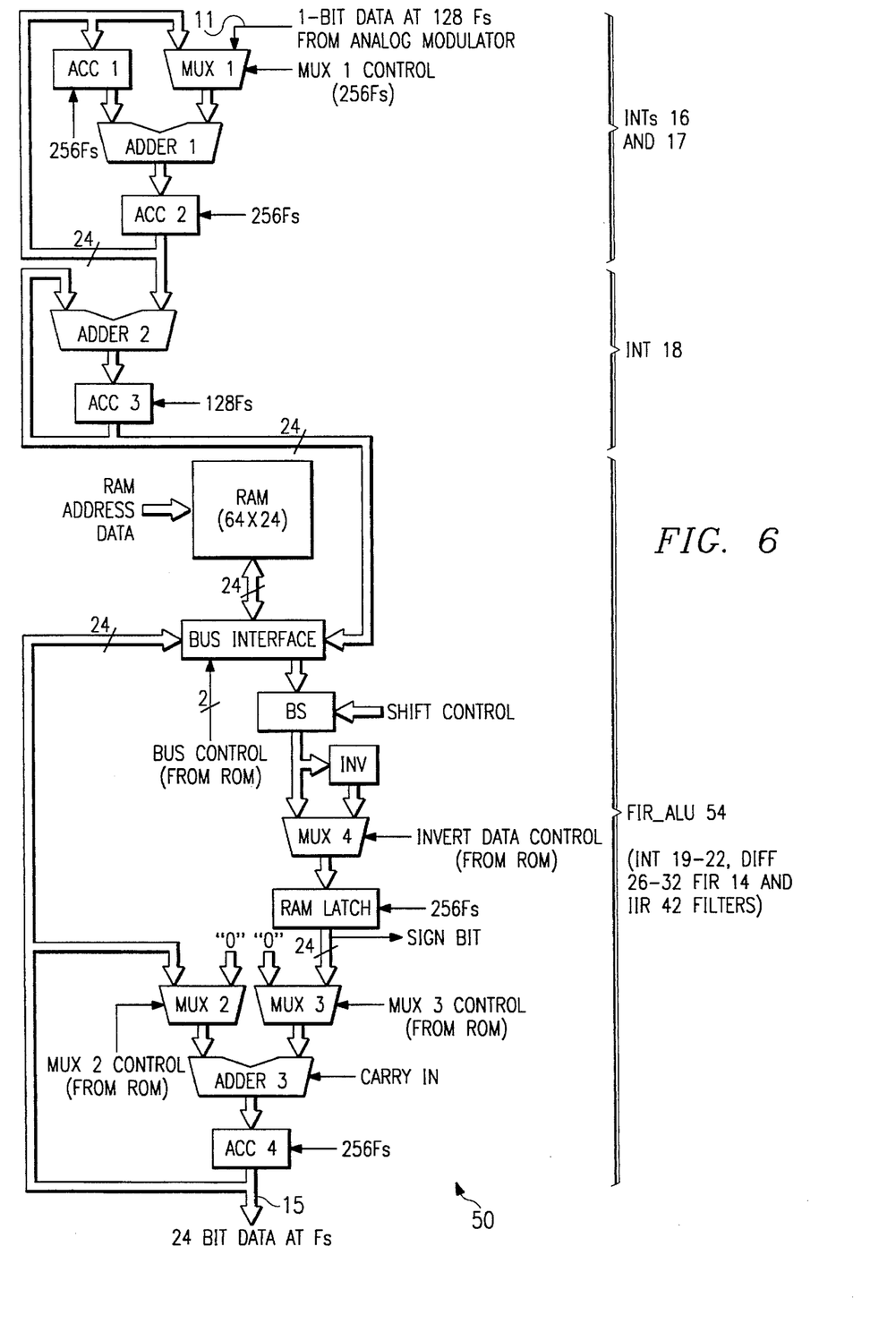
FIG. 6 is a block diagram of the computation units of the decimation filter shown in FIG. 5.

Referring now to a block diagram 50 of the computation units of the decimation filter 10 shown in FIG. 6, the input 11 to a multiplexer mux_1 is 1-bit data (running at 128 Fs) from the analog modulator. All of the rest of the main data paths are 24 bits wide as shown in FIG. 6. The output of mux_1 is connected to one input of an adder, adder_1, the output of which is connected to an accumulator, acc_2. The output of acc_2 is connected to the input of another accumulator acc_1, and to a second input of the mux_1. The output of acc_1 is connected to the second input of adder_1. The acc_1 and acc_2 are clocked by a 256 Fs clock, and with adder_1 they implement the first two high speed (128 Fs rate) integration functions of integrator stages 16 and 17.

The output of adder_1 is also connected to one input of another adder, adder_2, the output of which is connected to another accumulator, acc_3. The output of acc_3 forms the second input of adder_2. The acc_3 is clocked by a 128 Fs clock, and with adder_3 it implements the last high speed (128 Fs rate) integration, integrator stage 18.

Referring again to FIG. 6, a RAM; a bus interface; a barrel shifter, BS; three multiplexers, mux_2, mux_3 and mux_4; an inverter, INV; a latch, ram_lat; another adder, adder_3; and another accumulator, acc_4 form a FIR_ALU 54 used to implement FIR filtering, the remaining three integrations and seven differentiations and the high pass IIR filtering. As shown in FIG. 6 the bus interface receives the outputs of acc_3 and acc_4, sends and receives data from the RAM, and provides data to the barrel shifter BS. The barrel shifter BS is sign extension shifted such that the sign bit is used to fill in for the shifted data. The output of the BS is either transferred directly to the ram_lat through the mux_4 or inverted and then passed to the ram_lat through mux_4. The output of the ram_lat is connected to one input of mux_3, the output of which is connected to one input of adder_3. The output of adder_3 is connected to acc_4, the output of which is connected to the bus interface, one input of mux_2, and also forms the 24 bit data at Fs output at terminal 15 of the decimation filter 10. The output of mux_2 is connected to the second input of adder_3, and the second inputs of mux_2 and mux_3 are connected to data "0". The ram_lat and the acc_4 are clocked by a 256 Fs clock.

Figure 7:
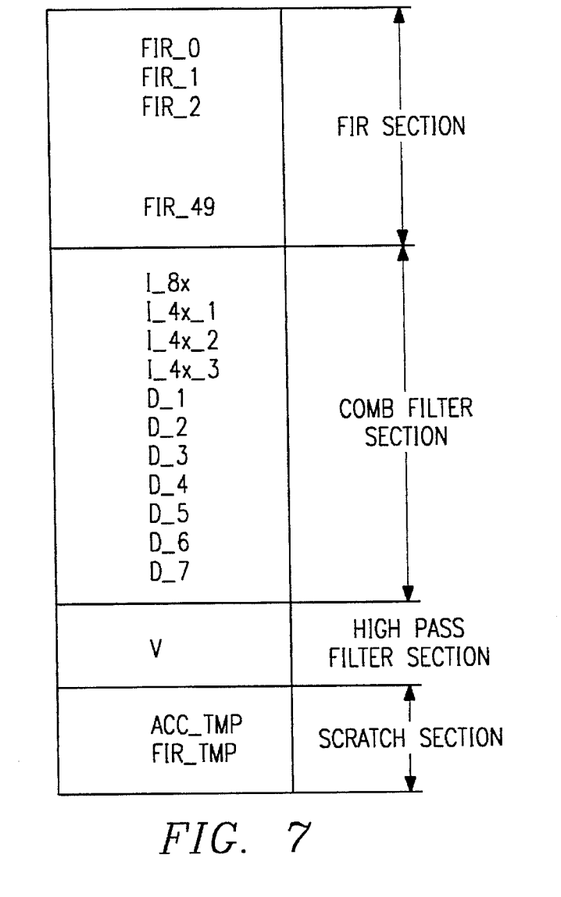
FIG. 7 is a diagram of the organization of the RAM of FIG. 6.

Referring now to FIG. 7, the RAM is divided into several conceptual sections:

FIR section—stores the data used in FIR computations. 50 words are needed for a 50-tap FIR filter.

comb filter section—4 words for the four integrators and 7 words for the seven differentiators.

high pass filter section—1 word corresponding to the DC offset scratch section—2 words for storing the partial accumulation result from acc_4 and temporary FIR input data.

Figure 8A:
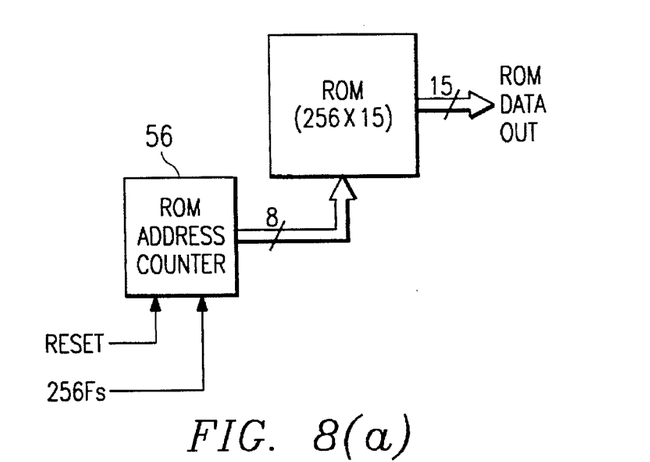
FIG. 8(a) is a block diagram of the ROM circuitry used with the computational units shown in FIG. 6.

FIG. 8(a) is a block diagram of the ROM circuitry used with the computational units shown in FIG. 6. The ROM receives sequential address bits from a ROM address counter 56 which is clocked at the 256 Fs rate, and is reset by a RESET command.

Figure 8B:
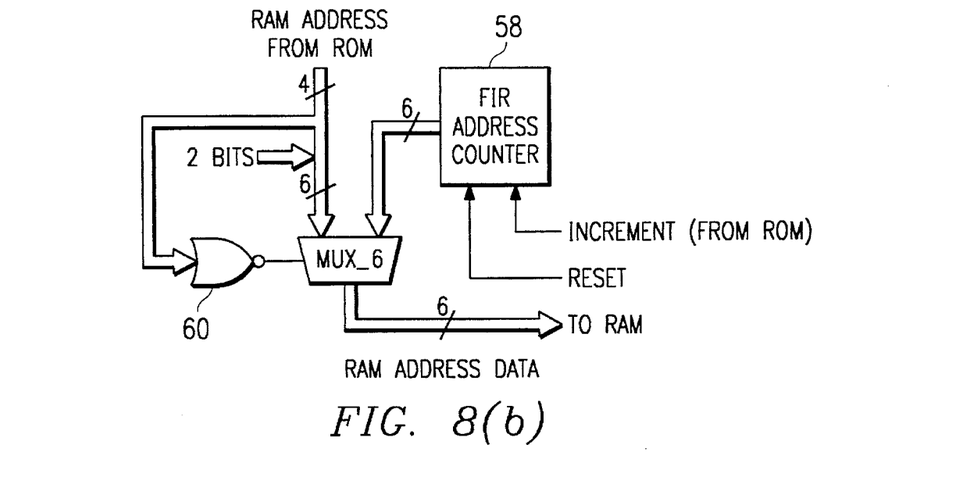
FIG. 8(b) is a block diagram of the RAM addressing scheme used in FIG. 6.
Figure 8C:
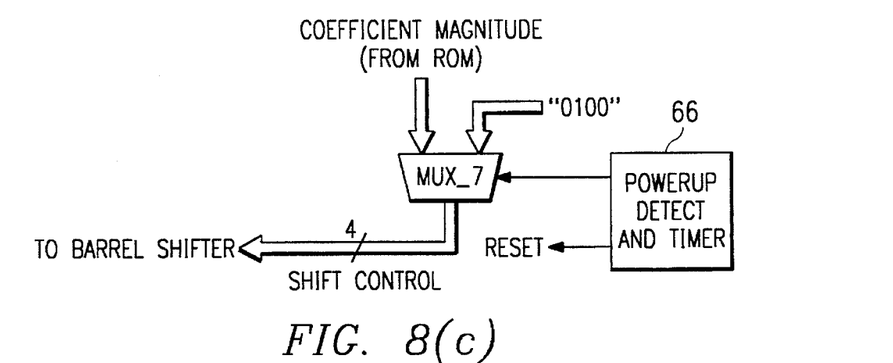
FIG. 8(c) is a block diagram of the control cirucitry of the barrel shifter shown in FIG. 6.

Referring now to FIG. 8(b), the address of the RAM comes from either the FIR address counter 58 (for addressing the FIR section) or from the addresses stored in the ROM (for addressing the rest of the RAM). The FIR address counter 58 is a modulo 50 circular counter to address the FIR section of the RAM. The RAM address from the ROM is only 4 bits wide since only 14 address locations of the RAM are addressed directly from the ROM. Therefore two additional predetermined bits are combined with the four RAM address bits from the ROM to provide the 6 address bits needed by the RAM. When the four RAM address bits from the ROM are all zero, then the four input NOR gate 60 provides a high level to the mux_6 to pass address bits to the RAM from the FIR address counter 58.

Figure 8D:
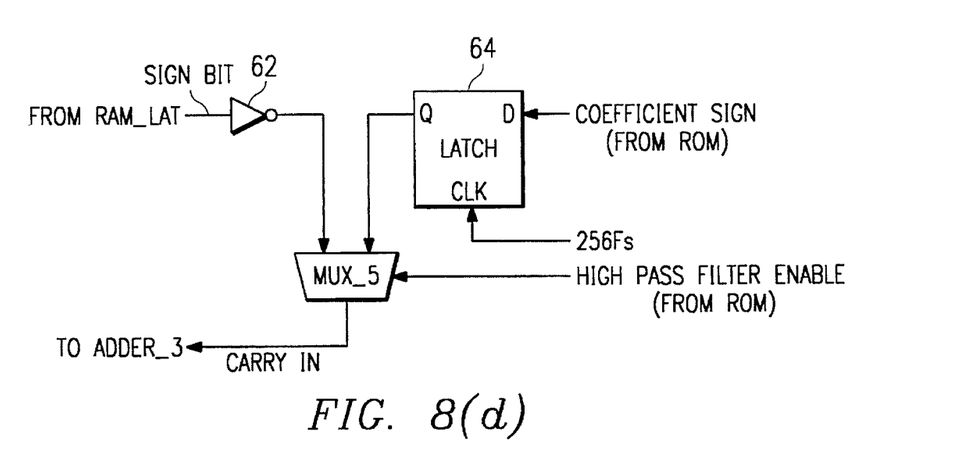
FIG. 8(d) is a block diagram of the carry in circuitry of adder_3 shown in FIG. 6.

At each clock cycle of the 256 Fs master clock, the control signals for the computation in adder 3 and the data transfers between the RAM and the computation unit are programmed in a ROM. The ROM is 256 words and each word is 15-bit long. Each word of the ROM consists of the following information:

coefficient sign and magnitude (5-bits)—used to control the barrel shifter (BS) (FIG. 6 and FIG. 8(d))

address information other than FIR (4-bit)—combined with FIR address counter to address the RAM (FIG. 8(b))

instructions (4-bits)—used to control mux_2, mux_3 and the RAM bus interface logic (FIG. 6)

FIR address counter increment (1-bit)—used to increment the FIR address counter 58 (FIG. 8(b))

high pass filter enable (1-bit)—used for high pass filtering (FIG. 8(d))

The output of the acc_3 (after decimation by 16) arrives at the input of the barrel shifter (BS) at the rate of every 32 clock cycles (256 Fs clock). To avoid unnecessary input buffering, all the integrations and differentiations in the FIR_ALU 54 are done in real time. That is, as soon as the inputs are available, the computations occur and the results are stored in the RAM. The FIR filter 14 and high pass IIR filter 42 computations are done in a sequential manner whenever the FIR_ALU 54 is free of doing integrations and differentiations. ACC_TMP in the RAM is used to store the intermediate FIR filter accumulation results. For every 256 clock cycle (256 Fs clock), there is one data word of the FIR filter for which the correct RAM address to store this data is not available from FIR address counter at the time it is generated. FIR_TMP is used to store this data until the correct RAM address is available.

The computation sequence (256 master clock cycles) for one output sample is illustrated as following:

| | |
|---|---|
| clock 0–3 | one integration at 8 Fs |
| clock 4–8 | three integrations at 4 Fs |
| clock 9–23 | seven differentiations at 2 Fs and update FIR data storage RAM |
| clock 24–27 | calculate DC offset (high pass filtering) |
| clock 28–31 | wait |
| clock 32–35 | one integration at 8 Fs |
| clock 36–63 | FIR filter computations (shifts and adds) |
| clock 64–67 | one integration at 8 Fs |
| clock 68–72 | three integrations at 4 Fs |
| clock 73–95 | FIR filter computations (shifts and adds) |
| clock 96–99 | one integration at 8 Fs |
| clock 100–127 | FIR filter computations (shifts and adds) |
| clock 128–131 | one integration at 8 Fs |
| clock 132–136 | three integrations at 4 Fs |
| clock 137–151 | seven differentiation at 2 Fs and temporary store FIR input data in FIR_TMP |
| clock 152–159 | FIR filter computations (shifts and adds) |
| clock 160–163 | one integration at 8 Fs |
| clock 164–191 | FIR filter computations (shifts and adds) |
| clock 192–195 | one integration at 8 Fs |
| clock 196–200 | three integrations at 4 Fs |
| clock 201–223 | FIR filter computations (shifts and adds) |
| clock 224–227 | one integration at 8 Fs |
| clock 228–250 | FIR filter computations (shifts and adds) |
| clock 251–252 | subtract DC offset from output (high pass filtering) |
| clock 253–255 | update FIR data storage RAM |

The above computation sequence repeats for every output data sample.

The high pass filter for eliminating the DC offset has the IIR form of $$H_4(z) = \frac{1 - z^{-1}}{1 - az^{-1}}$$

The 3 dB cutoff frequency of the IIR high pass filter is determined by $$|H_4(\omega_0)|^2 = \frac{2 - 2\cos\omega_0}{1 - 2(a \cdot \cos\omega) + a^2} = \frac{1}{2} \cdot \frac{4}{(1 + a)^2}$$

With $a = 1 - \Delta$ ($\Delta \ll 1$), we have $\omega_0 \cong \Delta$. With 44.1 kHz sampling frequency and $\Delta = 2^{-11}$, the 3 dB cutoff frequency is about 3 Hz. This cutoff frequency should be adequate for digital audio applications.

Figure 9A:
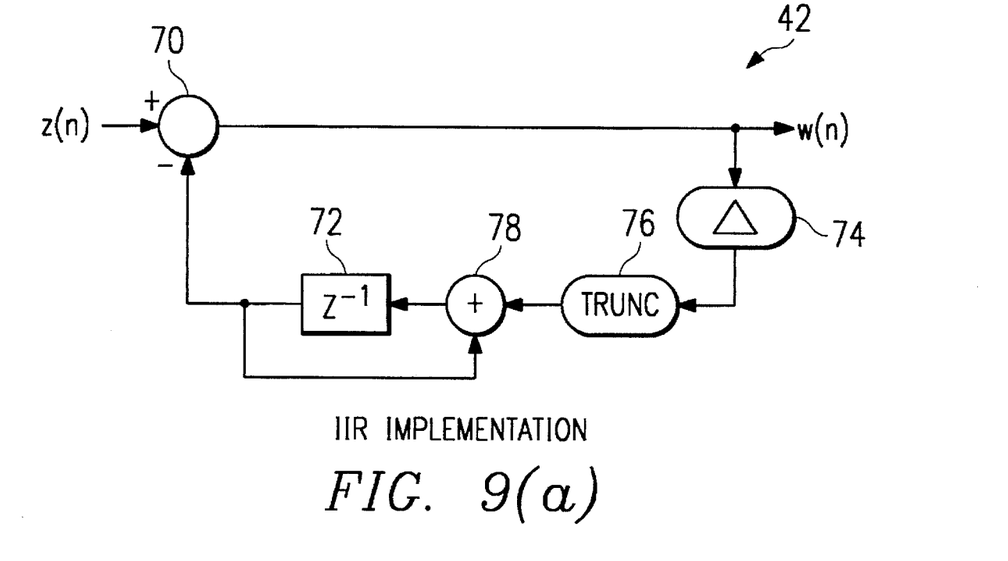
FIG. 9(a) is a block diagram of the conceptual implementation of the high pass IIR filter shown in FIG. 5.
Figure 9B:
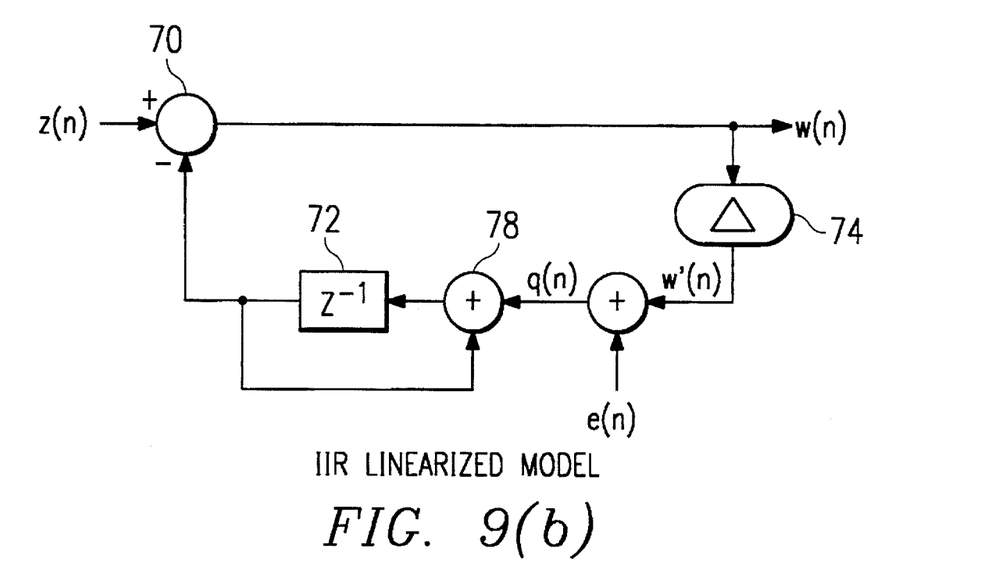
FIG. 9(b) is a block diagram of an analytical model for the high pass IIR filter shown in FIG. 9(a)

Referring now to FIG. 9(a) and FIG. 9(b), one efficient structure to implement this filter and its linearized model are shown. As shown in FIG. 9(a) an input signal z(n) is summed in a summing circuit 70 with the output of a one clock period delay circuit 72. The output of the summing circuit 70 forms the output w(n) of the IIR filter 42. The output w(n) is also right shifted in a shifter 74, the output of which is truncated by a truncation cirucit 76 during normal operation. The output of the truncation circuit is summed in a second summing circuit 78 with the output of the delay circuit 72. The only truncation in the filtering process occurs when w(n) is right shifted by 11 positions ($\Delta = 2^{-11}$), and the truncation error is modeled as uniform distributed white noise e(n) as shown in FIG. 9(b). This system has the transfer function of $$W(z) = \frac{1-z^{-1}}{1-(1-\Delta)z^{-1}} \cdot Z(z) + \frac{z^{-1}}{1-(1-\Delta)z^{-1}} \cdot E(z)$$

The quantization error has a huge DC gain of $1/\Delta$, so it is critical to maintain a zero mean quantization noise: $E(e(n))=0$.

Figure 10A:
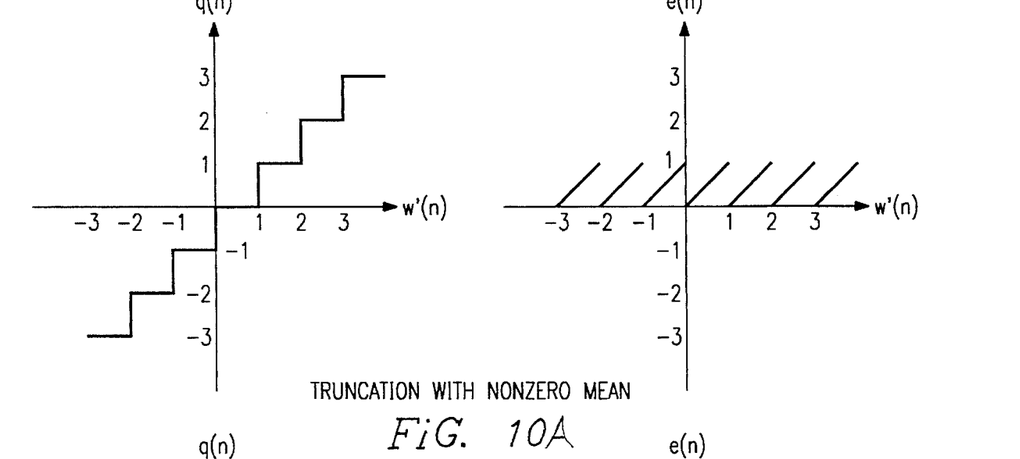
FIGS. 10(a), 10(b) and 10(c) are waveform plots for various possible truncation schemes for the high pass IIR filter of FIG. 9(a)

FIG. 10($a$) shows a conventional truncation in two's complement numbering system where $w'(n)=\Delta \cdot w(n)$, $q(n)$ is the result of truncation and $e(n)$ is the truncation error ($e(n)=w'(n)-q(n)$). In this truncation scheme, the quantization error is uniformly distributed in [0, 1] and $E(e(n))=0.5$.

Figure 10B:
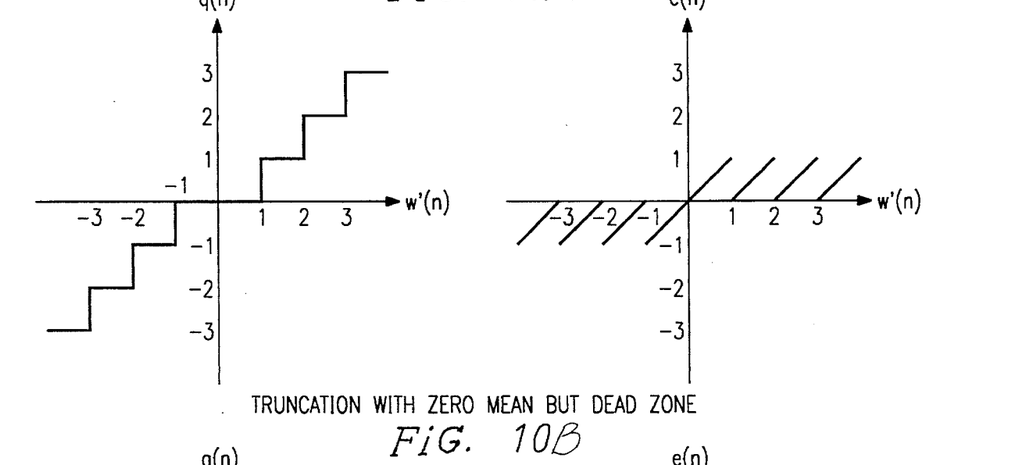

Referring now to FIG. 10($b$), the quantization error of this truncation scheme is uniformly distributed $[-1, 1]$, so it is zero mean. However, one problem associated with this truncation scheme is a dead zone. For example, suppose $z(n)$ is a small DC signal (less than 11 bits for $\Delta=2^{-11}$) and the feedback integrator is initialized as zero, then $w(n)=z(n)$, $w'(n)=\Delta \cdot w(n)$, thus $q(n)=0$. In this case, no DC information will be accumulated in the feedback integrator, thus no desired DC cancellation can occur.

Figure 10C:
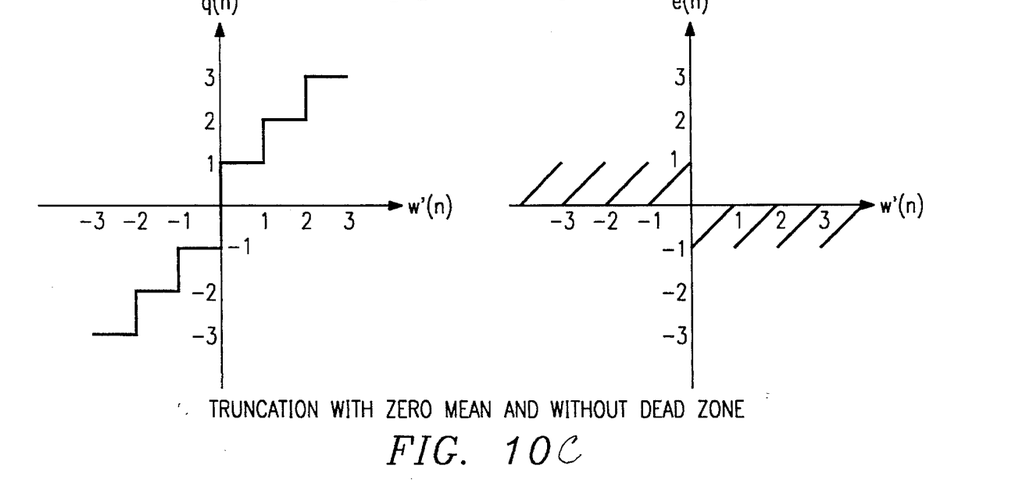

Referring now to FIG. 10($c$), in this truncation scheme, the quantization error is still zero mean, but unlike the truncation in FIG. 10($b$), the output of the truncation $q(n)$ never takes on value zero, thus the feedback integrator is always active and no dead zone is possible.

FIG. 8($d$) shows the hardware implementation of the truncation scheme illustrated in FIG. 10($c$). During high pass filtering, the carry-in of adder_3 is the complement of the sign bit of $w(n)$ using an inverter 62. During the time other than high pass filtering, the carry-in of adder 3 is the one clock delay (using latch 64) of the coefficient sign bit (stored in the ROM). The one clock delay of the sign bit is due to the fact that there is a pipeline register (ram_lat) between the barrel shifter (BS) and adder_3.

A high pass filter with a low cutoff frequency (3 Hz for 44.1 kHz sampling frequency) tends to have very long settling time. Let us consider the IIR high pass filter again:

$$H_4(z) = \frac{1-z^{-1}}{1-az^{-1}} = 1 + (a-1)\sum_{i=1}^{\infty} a^{(i-1)}z^{-i}$$

where $a=1-\Delta$.
The unit step response of the IIR high pass filter is $$y(n) = \sum_{i=0}^{n} h_4(i) = a^n$$

In order to achieve half of 1 LSB settling (in the 18-bit case), we need $y(n)=a^n \leq 2^{-19}$. For $a=1-\Delta=1-2^{-m}$, we have $$n \geq \frac{19\ln 2}{-\ln(1-2^{-m})} \cong 13.2 \cdot 2^m$$

Tab. 2 summarizes the settling time vs. some values of m

TABLE 2 settling time vs. m

| m | n | settling time (ms) at Fs = 44.1 kHz |
|---|---|---|
| 11 | 27033 | 613 |
| 10 | 13516 | 307 |
| 9 | 6758 | 154 |
| 8 | 3379 | 77 |
| 7 | 1689 | 39 |

TABLE 2-continued settling time vs. m

| m | n | settling time (ms) at Fs = 44.1 kHz |
|---|---|---|
| 6 | 844 | 20 |
| 5 | 422 | 10 |
| 4 | 211 | 5 |

As the table shows, for a cutoff frequency of 3 Hz ($\Delta=2^{-11}$), it takes the high pass filter more than 600 ms to settle. This long settling time is not acceptable in the digital audio application.

Referring now to FIG. 8($c$), in order to achieve fast settling time while keeping the correct high pass filter frequency response at normal operation, a high pass filter coefficient switching circuit has been implemented using a multiplexer mux_7 to provide the shift control to the barrel shifter BS. The mux_7 is controlled by a pulse from a powerup detect and timer circuit 66. During normal operation the shift control is passed through mux_7 to the BS from the coefficient magnitude output of the ROM. During powerup of the chip, however, the bit pattern "0100" is passed to the BS through the mux_7.

Figure 11:
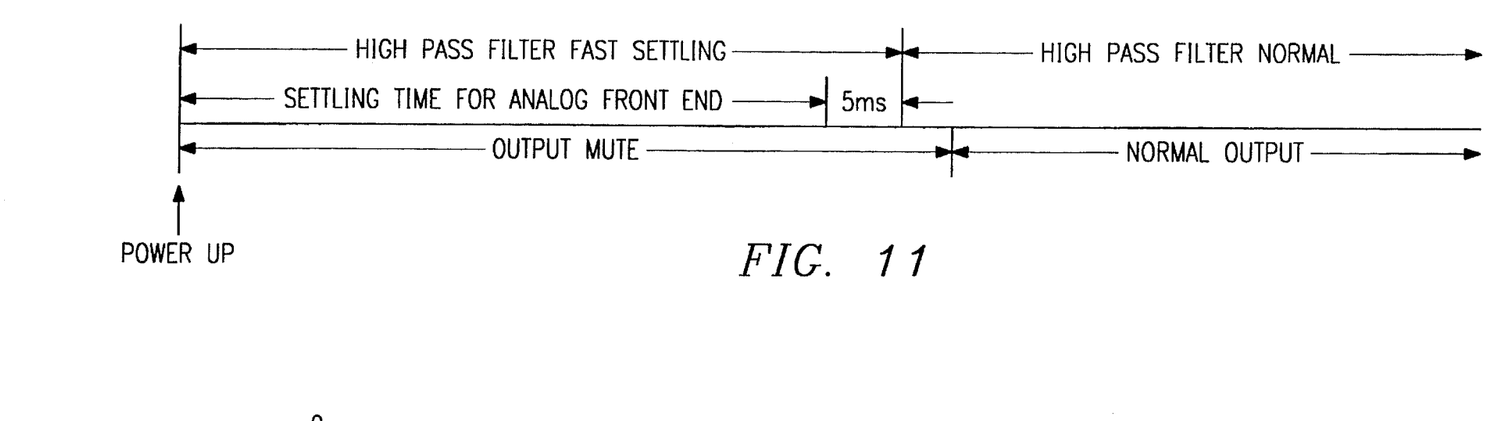
FIG. 11 is a timing diagram for the start up operation of the high pass IIR filter shown in FIG. 5.

Referring now to FIG. 11 and FIG. 8($c$). During the initial setup of the analog-to-digital converter (usually occurring at power up of the chip), the high pass filter coefficient is set to $\Delta=2^{-4}$ (implemented as "0100" in FIG. 8($c$)). After the settling of analog circuits (where the DC offset comes from), the high pass filter stays in fast settling mode for 5 ms to obtain the correct DC offset value. Then the high pass filter coefficient is switched to $\Delta=2^{-11}$ for normal operation.

During the high pass filter fast settling mode, the output of the analog-to-digital converter is muted by holding the output data (in serial data stream format) at a zero level.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

What is claimed is:

1. In a decimation filter having at least one decimation stage and a plurality of integrator stages and a like plurality of differentiator stages in which at least one of the integration or differentiation stages has its own adder and accumulator hardware, the improvement comprising implementing at least one of the integration stages, said at least one decimation stage, and at least one of the differentiation stages together with a FIR filter in shared hardware which has a single adder.

2. The improvement set forth in claim 1 wherein said shared hardware also includes a single RAM, a single barrel shifter, a single accumulator, and at least one multiplexer.

3. The improvement set forth in claim 2 wherein said shared hardware also includes a ROM wherein each word of said ROM is divided into a plurality of segments, each of said segments being used to control different parts of said shared hardware.

4. The improvement set forth in claim 3 wherein said plurality of segments include:

a) a segment for coefficient sign and magnitude for said barrel shifter in CSD format;

b) a segment for RAM addressing;

c) a segment to control said at least one multiplexer;

d) a segment to increment a counter which, in turn, also provides addressing information to said ROM; and e) a segment to control a high pass filter.

5. The improvement set forth in claim 1 wherein said shared hardware also implements an IIR filter.

6. In a decimation filter having at least one decimation stage and a plurality of integrator stages and a like plurality of differentiator stages in which at least one of the integration or differentiation stages has its own adder and accumulator hardware, the improvement comprising implementing at least one of the integration stages, said at least one decimation stage, and at least one of the differentiation stages together with a FIR filter in shared hardware which has a single barrel shifter.

7. The improvement set forth in claim 6 wherein said shared hardware also includes a single RAM, a single adder, a single accumulator, and at least one multiplexer.

8. In a decimation filter having at least one decimation stage and a plurality of integrator stages and a like plurality of differentiator stages in which at least one of the integration or differentiation stages has its own adder and accumulator hardware, the improvement comprising implementing at least one of the integration stages, said at least one decimation stage, and at least one of the differentiation stages together with a FIR filter in shared hardware which has a single RAM.

9. The improvement set forth in claim 8 wherein said shared hardware also includes a single accumulator, a single barrel shifter, a single adder, and at least one multiplexer.

10. The improvement set forth in claim 9 wherein said RAM is addressed by a single address decoder and is divided into a plurality of segments.

11. The improvement set forth in claim 10 wherein said plurality of segments include:

a) a segment for storing FIR data;

b) a segment for storing a portion of said integration and differentiation data;

c) a segment to store a DC offset for use by a high pass filter section; and d) a segment to store temporary intermediate data.

12. A method of filtering and decimating an oversampled digital data stream comprising the steps of:

a) integrating said oversampled digital data stream by adding said data stream with a first n-bit digital word in a first adder to form a first intermediate signal during a first time period, said first intermediate signal forming said n-bit digital word for the next time period after said first time period;

b) integrating said first intermediate signal by adding said first intermediate signal with a second intermediate signal in said first adder to form a third intermediate signal during a second time period, said third intermediate signal forming said second intermediate signal for the next time period after said second time period;

c) integrating said third intermediate signal by adding said third intermediate signal with a fourth intermediate signal in a second adder to form a fifth intermediate signal during a third time period, said fifth intermediate signal forming said fourth intermediate signal for the next time period after said third time period;

d) integrating every sixteenth of said fifth intermediate signals by adding said every sixteenth fifth intermediate signal to a sixth intermediate signal in a third adder to form a seventh intermediate signal in a fourth time period, said seventh intermediate signal forming said sixth intermediate signal for the next time period after said fourth time period;

e) integrating every other of said seventh intermediate signals by adding every other of said seventh intermediate signals to an eighth intermediate signal in said third adder to form a ninth intermediate signal in a fifth time period, said ninth intermediate signal forming said eighth intermediate signal for the next time period after said fifth time period;

f) integrating said ninth intermediate signals by adding said ninth intermediate signals to a tenth intermediate signal in said third adder to form an eleventh intermediate signal in a sixth time period, said eleventh intermediate signal forming said tenth intermediate signal for the next time period after said sixth time period;

g) integrating said eleventh intermediate signal by adding said eleventh intermediate signal to a twelfth intermediate signal in said third adder to form a thirteenth intermediate signal in an seventh time period, said thirteenth intermediate signal forming said twelfth intermediate signal for the next time period after said seventh time period;

h) differentiating every other of said thirteenth intermediate signals by combining said every other of said thirteenth intermediate signals to a fourteenth intermediate signal in said third adder to form a fifteenth intermediate signal in an eighth time period, said thirteenth intermediate signal from the time period before said eighth time period forming said fourteenth intermediate signal for said eighth time period;

i) differentiating said fifteenth intermediate signal by combining said fifteenth intermediate signal to a sixteenth intermediate signal in said third adder to form a seventeenth intermediate signal in a ninth time period, said fifteenth intermediate signal from the time period before said ninth time period forming said sixteenth intermediate signal for said ninth time period;

j) differentiating said seventeenth intermediate signal by combining said seventeenth intermediate signal to an eighteenth intermediate signal in said third adder to form a nineteenth intermediate signal in a tenth time period, said seventeenth intermediate signal from the time period before said tenth time period forming said eighteenth intermediate signal for said tenth time period;

k) differentiating said nineteenth intermediate signal by combining said nineteenth intermediate signal to a twentieth intermediate signal in said third adder to form a twenty-first intermediate signal in an eleventh time period, said nineteenth signal from the time period before said eleventh time period forming said twentieth intermediate signal for said eleventh time period;

l) differentiating said twenty-first intermediate signal by combining said twenty-first intermediate signal to a twenty-second intermediate signal in said third adder to form a twenty-third intermediate signal in a twelfth time period, said twenty-first intermediate signal from the time period before said twelfth time period forming said twenty-second intermediate signal for said twelfth time period;

m) differentiating said twenty-third intermediate signal by combining said twenty-third intermediate signal to a twenty-fourth intermediate signal in said third adder to form a twenty-fifth intermediate signal in a thirteenth time period, said twenty-third intermediate signal from the time period before said thirteenth time period forming said twenty-fourth intermediate signal for said thirteenth time period; and n) differentiating said twenty-fifth intermediate signal by combining said twenty-fifth intermediate signal to a twenty-sixth intermediate signal in said third adder to form an output intermediate signal in a fourteenth time period, said twenty-fifth intermediate signal from the time period before said fourteenth time period forming said twenty-sixth added signal for said fourteenth time period.

* * * * *